United States Patent
You (10) Patent No.: US 10,755,722 B2
(45) Date of Patent: Aug. 25, 2020

(54) MULTIBAND AUDIO SIGNAL DYNAMIC RANGE COMPRESSION WITH OVERSHOOT SUPPRESSION

(71) Applicant: Guoguang Electric Company Limited, Guangzhou (CN)

(72) Inventor: Yuli You, Laguna Beach, CA (US)

(73) Assignee: Guoguang Electric Company Limited, Guangzhou (CN)

( * ) Notice: Subject to any disclaimer, the term of this patent is extended or adjusted under 35 U.S.C. 154(b) by 147 days.

(21) Appl. No.: 16/115,840

(22) Filed: Aug. 29, 2018

(65) Prior Publication Data
US 2020/0075031 A1 Mar. 5, 2020

(51) Int. Cl.
G10L 19/02 (2013.01)
G10L 19/26 (2013.01)

(52) U.S. Cl.
CPC .......... G10L 19/0204 (2013.01); G10L 19/26 (2013.01)

(58) Field of Classification Search
CPC ....... G10L 19/0204; G10L 19/26; H03G 9/02; H03G 9/00; H03G 9/005; H03G 9/18; H03G 9/025
USPC ......................................................... 704/500
See application file for complete search history.

(56) References Cited

U.S. PATENT DOCUMENTS

| | | | | | |
|---|---|---|---|---|---|
| 4,493,091 A | * | 1/1985 | Gundry | ................. | H03G 9/005 375/249 |
| 4,701,722 A | * | 10/1987 | Dolby | .................... | H03G 9/025 333/14 |
| 4,887,299 A | * | 12/1989 | Cummins | ............ | H04R 25/356 381/317 |
| 4,922,535 A | * | 5/1990 | Dolby | .................... | H03G 7/004 704/500 |
| 5,185,806 A | * | 2/1993 | Dolby | .................... | H03G 9/005 333/14 |
| 9,559,650 B1 | * | 1/2017 | Skovenborg | ........... | H03G 7/007 |
| 2003/0052979 A1 | * | 3/2003 | Soga | .................... | H04N 1/2112 348/241 |

(Continued)

FOREIGN PATENT DOCUMENTS

JP 2009159433 A 7/2009

OTHER PUBLICATIONS

Compensation of Crossover Region Overshoot in Multiband Compression ; David Traor'e Apr. 26-29, 2014 (Year: 2014).*

(Continued)

Primary Examiner — Akwasi M Sarpong
(74) Attorney, Agent, or Firm — Joseph G Swan, PC (57) ABSTRACT

Provided is an audio-signal dynamic-range-compression system. An input line accepts an input signal. A filter set coupled to the input line divides the input signal into a set of frequency bands, including a first frequency band and a second frequency band. A compressor has a first input that receives the first frequency band, a second input and an output. An adder has a first input coupled to the output of the compressor, a second input coupled to the second frequency band, and an output. An overshoot estimation module has an input coupled to the output of the adder and an output coupled to the second input of the compressor. The output of the overshoot estimation module provides an overshoot signal that indicates a result of a comparison between a signal at the input of the overshoot estimation module and a specified threshold.

20 Claims, 8 Drawing Sheets

(56) References Cited

U.S. PATENT DOCUMENTS

| | | | | |
|---|---|---|---|---|
| 2006/0233408 A1* | 10/2006 | Kates | ............... | H03G 7/002 |
| | | | | 381/321 |
| 2006/0274904 A1* | 12/2006 | Lashkari | ............... | H03F 1/3264 |
| | | | | 381/59 |
| 2009/0116664 A1* | 5/2009 | Smirnov | ............... | H03G 7/007 |
| | | | | 381/106 |
| 2011/0135126 A1 | 6/2011 | Gozen | | |
| 2011/0305382 A1* | 12/2011 | Takahashi | ............ | A61B 6/5211 |
| | | | | 382/132 |
| 2013/0216049 A1* | 8/2013 | Wolf | ............... | H04R 1/00 |
| | | | | 381/55 |
| 2013/0272543 A1* | 10/2013 | Tracey | ............... | H03G 5/005 |
| | | | | 381/107 |
| 2015/0263690 A1 | 9/2015 | Goto et al. | | |
| 2015/0372653 A1 | 12/2015 | Onodera | | |
| 2016/0005407 A1 | 1/2016 | Friedrich et al. | | |

OTHER PUBLICATIONS

D. Traore, et al., "Compensation of Crossover Region Overshoot in Multiband Compression", 2014 Audio Engineering Society Convention 136.

D. Giannoulis, M. Massberg, and J. Reiss, 2013, "Parameter Automation in a Dynamic Range Compressor." Journal of the Audio Engineering Society, 716-726.

D. Giannoulis, M. Massberg, and J. Reiss. 2012, "Digital Dynamic Range Compressor Design—A Tutorial and Analysis," Journal of Audio Engineering Society 60: pp. 399-408.

Office Action in corresponding Japanese Patent Application No. 2019-002731, dated Apr. 20, 2020, together with summary/translation of same.

* cited by examiner

MULTIBAND AUDIO SIGNAL DYNAMIC RANGE COMPRESSION WITH OVERSHOOT SUPPRESSION

FIELD OF THE INVENTION

Oil The present invention pertains, among other things, to systems, methods and techniques for audio signal processing, such as multiband processing for audio signal dynamic range compression with suppression of associated overshooting.

BACKGROUND

When a single dynamic range compressor (DRC) is applied to the entire bandwidth of an audio signal, the resulting gain reduction is applied to the entire signal (i.e., across its entire spectrum). The effect is similar to turning down a volume control, but automatically and in response to an increase in the signal's level, e.g., in order to attempt to avoid playback distortion and/or equipment damage, or simply to avoid excessive volume that might disturb others. Unfortunately, one problem arising from this simplistic approach to range compression is that an individual loud event, e.g. originating from a single instrument, such as a kick drum, can trigger gain reduction for the entire audio signal, even though other components of the audio do not need, or are not desired, to be reduced in volume in order to achieve the desired effect. For example, as a result of such whole-signal processing, the vocals within the audio signal might be reduced to an unacceptably low level during the period that gain reduction is being applied.

This problem conventionally has been mitigated by instead using a multiband dynamic range compressor, which employs different compressors for different frequency bands. With this approach, a loud event in one frequency band triggers gain reduction in that band only, leaving the other bands largely untouched. For example, a loud event from a kick drum will be compressed solely by a compressor covering only the particular low-frequency band in which the corresponding burst of signal energy is occurring, leaving alone sounds that occur in other (e.g., mid-range and high-frequency bands).

Figure 1:
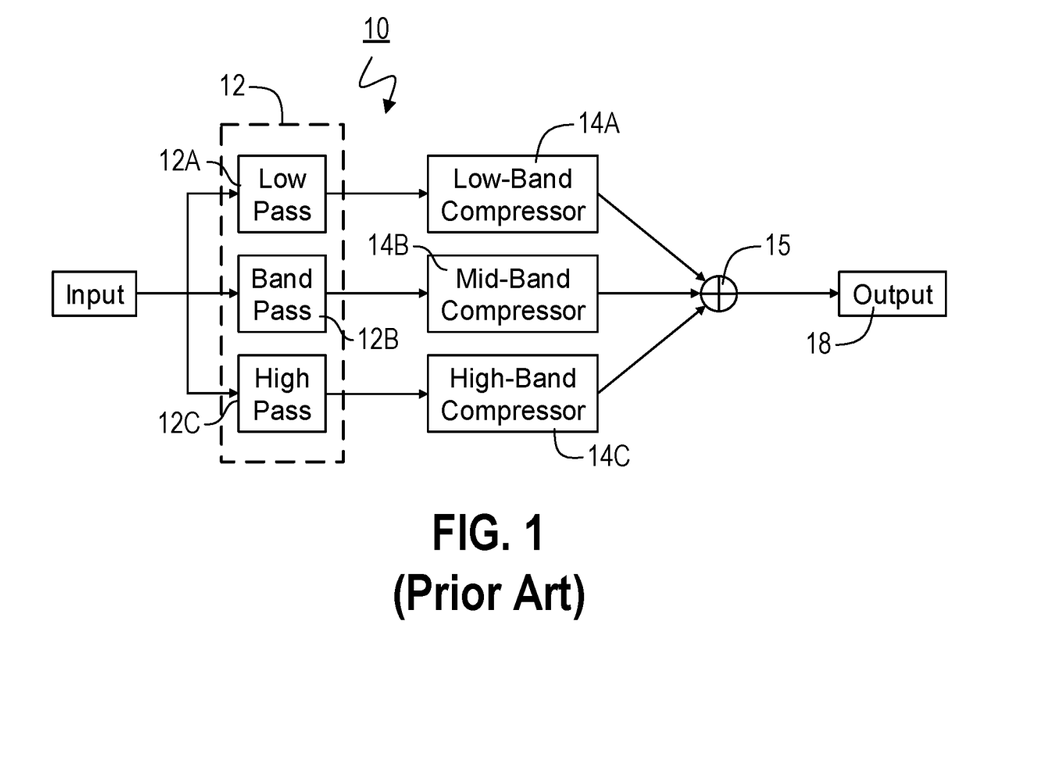
FIG. 1 is a block diagram of a conventional three-band dynamic range compressor.

As shown in FIG. 1, a conventional multiband compressor 10 comprises a set 12 of filters (including individual filters 12A-C) that splits the audio signal into two or more frequency bands (three in the present example). Each frequency band is then processed by its own separate compressor (with the output of each of filters 12A-C coupled to one of the compressors 14A-C, respectively). The outputs from these compressors 14A-C are recombined in adder 15 to form the output signal 18.

Figure 2:
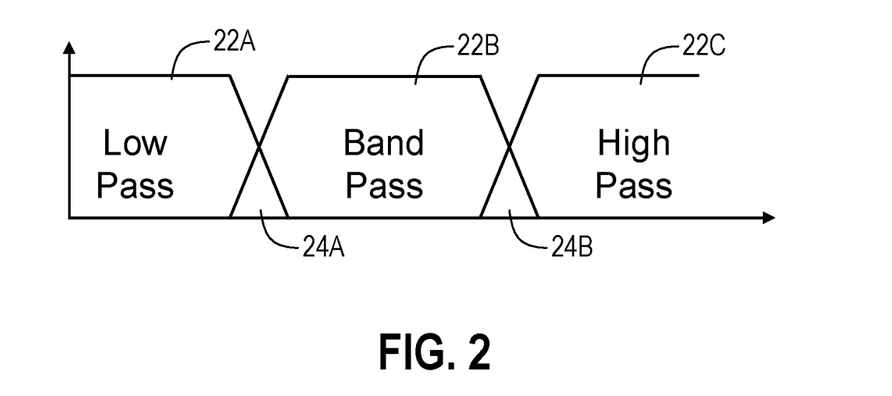
FIG. 2 conceptually illustrates the three bands processed by the range compressor of FIG. 1.

Unfortunately, one significant problem with multiband compressors such as compressor 10 is that the compressed signal 18 often overshoots above the target compression threshold. This situation primarily occurs as a result of input audio signal energy within the crossover or overlapping regions of the frequency bands. In this regard, each of the filters 12A-C outputs a corresponding frequency band 22A-C, as illustrated in FIG. 2, with adjacent frequency bands overlapping (e.g., overlap region 24A between bands 22A&B and overlap region 24B between bands 22B&C).

Figure 3:
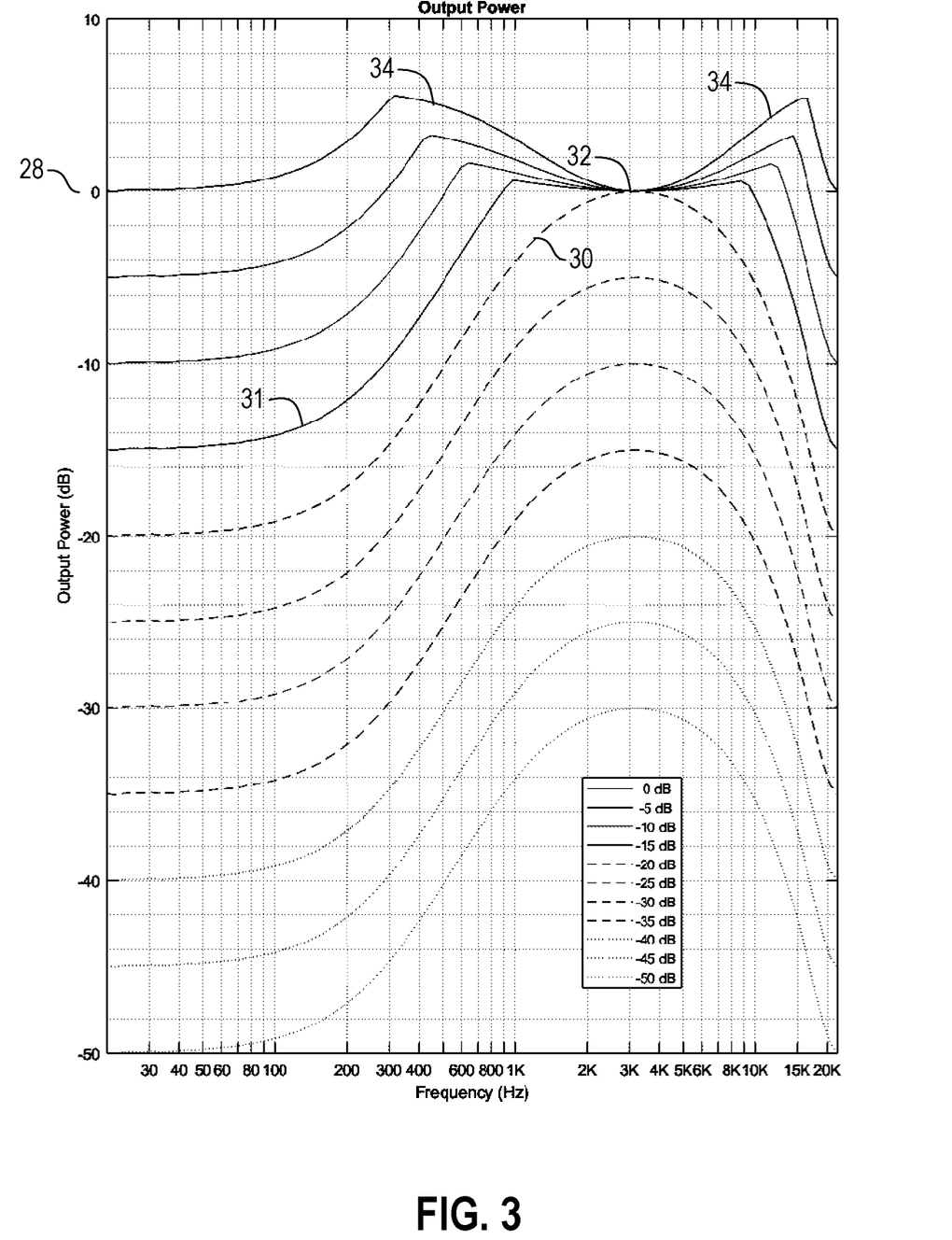
FIG. 3 illustrates the output power provided by a conventional range compressor, without mitigation of overshooting, across the frequency spectrum for input power levels ranging from −50 dB (the very bottom curve) to 0 dB (the very top curve), in 5 dB increments.

The overshooting effect noted in the preceding paragraph is illustrated in FIG. 3 for a two-band dynamic range compressor in which a compressor is applied to the passband, and the stopband is left uncompressed. For ease of reference, the term "uncompressed", as used herein without further elaboration, means that the subject signal (typically, a particular band-limited signal or, more succinctly, frequency band) has not been range-compressed. In this example, the passband crossover frequencies are set at 1 kilohertz (kHz) and 10 kHz. Its compressor has a 20 decibel (dB) maximum gain and a desired limiting threshold of 0 dB. The 20-dB gain can be clearly seen when the input level is low (i.e., the lower curves, such as curve 30 and below, shown in FIG. 3). When the input level increases (represented by the higher curves, such as curve 31 and above), the limiter starts to kick in, to limit the output level, ideally to a maximum of 0 dB, which is the desired limiting threshold 28 in the current example. However, this limit 28 typically is only imposed around the center frequency 32 (which is 3.162 kHz in the current example) and for frequencies far away from the crossover frequencies 34. As can be seen in FIG. 3, within and around the crossover frequencies 34, the input signal energy is not fully suppressed by the stopband filter, causing the output signal to overshoot this desired limit 28, so that it reaches levels as high as almost 6 dB.

Conventional approaches to mitigating this problem include: (1) E. Lindemann, "The continuous frequency dynamic range compressor," Proceedings of 1997 Workshop on Applications of Signal Processing to Audio and Acoustics, New Paltz, N.Y., USA, 1997, DOI: 10.1109/AS-PAA.1997.625580, ISBN: 0-7803-3908-8, which addresses this problem by increasing the number of bands and extending the overlap region between bands; (2) E. Vickers, "The Non-Flat and Continually Changing Frequency Response of Multiband Compressors". 2010, Audio Engineering Society (AES) Convention 129, which employs a frequency-domain approach that examines the input signal near the crossover regions and recalculates the band boundaries so that the peak falls entirely within a single band (thereby limiting the amount of signal energy that occurs in the crossover regions); and (3) D. Traore, J. Atkins, "Compensation of Crossover Region Overshoot in Multiband Compression", 2014 AES Convention 136, in which a frequency-decomposition module (which attempts to provide an estimate of the overshoot by determining the amount of input signal energy within the crossover regions) and a gain-compensation filter (which attempts to limit the effects of such anticipated overshoot) are provided at the beginning of the gain path of each compressor.

SUMMARY OF THE INVENTION

However, the present inventor has discovered that a typical problem with the conventional approaches to mitigating overshoot (e.g., those described above) is that they tend to use sophisticated filter banks and/or frequency-domain processing, and therefore usually are not suitable for real-time applications where low-cost microcontroller units (microcontrollers or MCUs) or digital signal processors (DSPs) are employed. In order to address this problem, the present invention provides, among other things, a relatively simple approach in which the preferably delayed output of a compressor is fed back to the input of the gain path of the same compressor to suppress overshooting in subsequent samples.

Thus, one embodiment of the invention is directed to an audio-signal dynamic-range-compression system in which an input line accepts an input signal. A filter set coupled to the input line divides the input signal into a set of frequency bands, including a first frequency band and a second frequency band. A compressor has a first input that receives the first frequency band, a second input and an output. An adder has a first input coupled to the output of the compressor, a second input coupled to the second frequency band, and an output. An overshoot estimation module has an input coupled to the output of the adder and an output coupled to the second input of the compressor. The output of the overshoot estimation module provides an overshoot signal that indicates a result of a comparison between a signal at the input of the overshoot estimation module and a specified threshold.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the accompanying drawings. However, it should be understood that the drawings merely depict certain representative and/or exemplary embodiments and features of the present invention and are not intended to limit the scope of the invention in any manner. The following is a brief description of each of the accompanying drawings.

DESCRIPTION OF THE PREFERRED EMBODIMENT(S)

Figure 4:
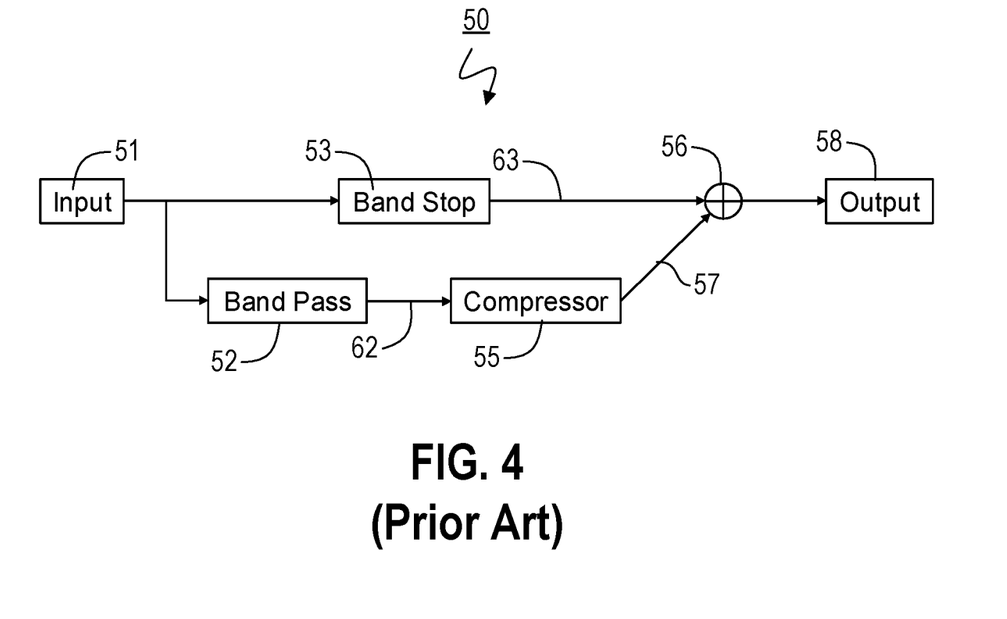
FIG. 4 is a block diagram showing a conventional dynamic equalizer, for processing a single band of an input signal.

A conventional dynamic equalizer (DEQ) 50, which is used in one of the simplest forms of multiband dynamic-range-compression systems, is shown in FIG. 4. It uses two filters 52 and 53 to split the input signal 51 into two corresponding portions: a band pass filter 52 selects a pass band 62 (shown in FIG. 5) and a band stop filter 53 selects the rest of the spectrum, referred to as the stop band 63 (also shown in FIG. 5), with some overlap 65 between the pass band 62 and the stop band 63. A compressor 55 is applied to the passband 62 only. Finally, in adder 56 the compressed version 57 of passband signal 62 is combined with the uncompressed stopband signal 63 to provide an output signal 58. Cascading multiple such dynamic equalizers 50 can provide a multiband compressor with a flexible set of frequency bands.

Figure 5:
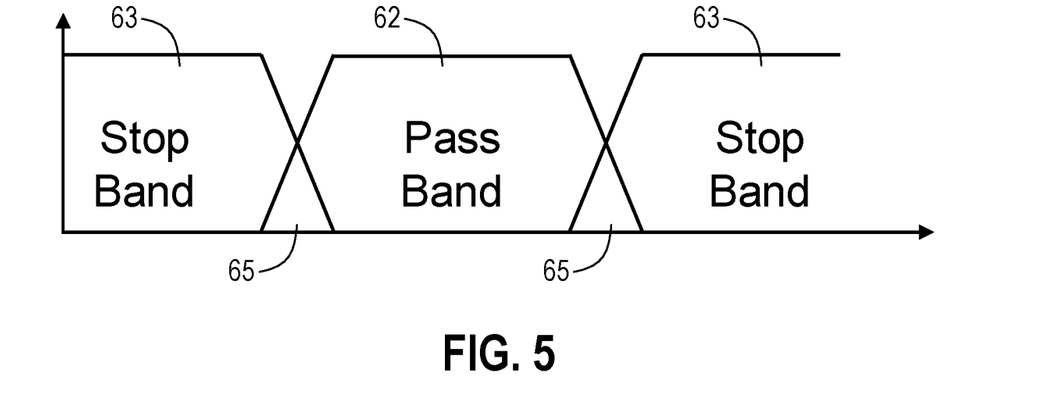
FIG. 5 conceptually illustrates the pass band and the stop band produced by the filters of the dynamic equalizer shown in FIG. 4.

Although bandpass and bandstop filtering are used in the present example, in alternate embodiments a lowpass or highpass filter instead is used to produce the passband 62, and the corresponding stopband filter 53 preferably is the complementary highpass or lowpass filter, respectively. In this regard, it is noted that, unless otherwise stated to the contrary with respect to a particular instance, use herein of a term such as "frequency band" is intended to mean either a finite band having an upper cutoff frequency and a nonzero lower cutoff frequency, a band having only an upper cutoff frequency, or a band having only a lower cutoff frequency.

Figure 6:
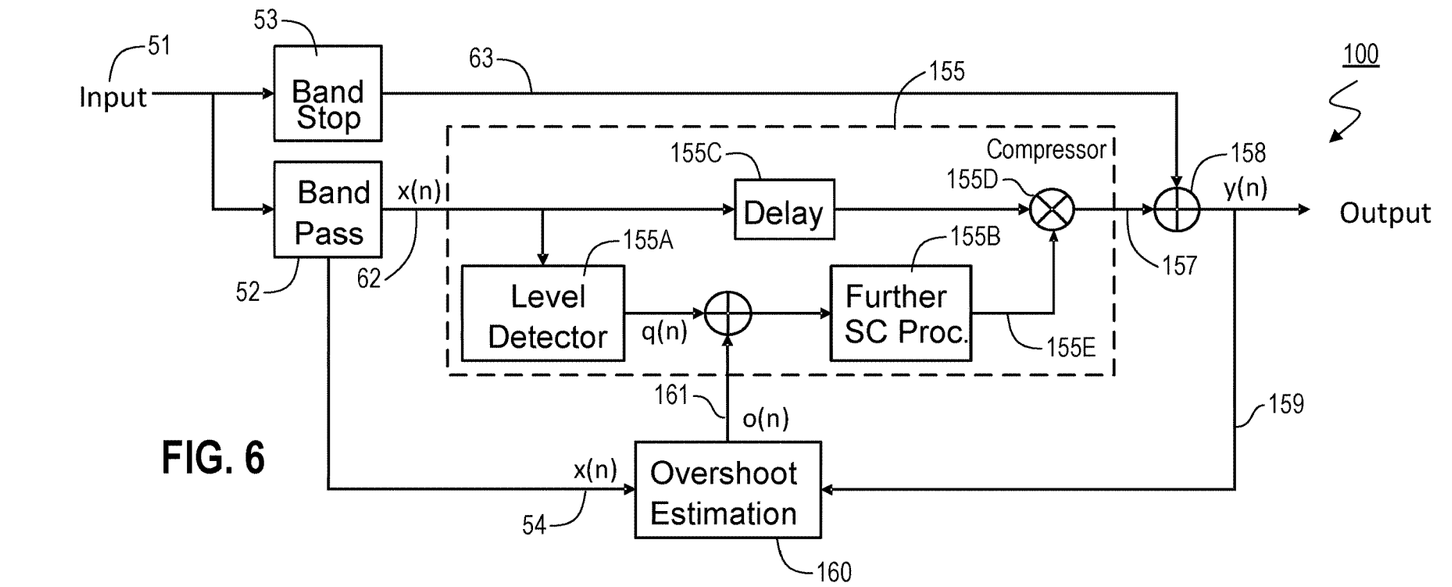
FIG. 6 is a block diagram of a dynamic compressor that provides overshooting suppression by modifying the signal input into a compressor's side chain based on a feedback overshoot signal.

An alternate DEQ system 100, one that includes overshooting suppression according to the present invention, is shown in FIG. 6. Similar to system 50, discussed above, system 100 includes a bandpass filter 52 (providing passband signal 62, sometimes referred to as x(n)), a band stop filter 53 (providing stopband signal 63) and a compressor 155 (which may be similar to compressor 55). In addition, unlike system 50, system 100 includes an overshoot estimation module 160, which estimates the amount of overshooting within a combination of the compressed output signal 157 and stopband signal 63 which is provided by adder 158. Adder 158 has inputs coupled to the compressed output signal 157 and the stopband signal 63 and an output that provides a combined signal 159 (sometimes referred to as y(n)). The present embodiment focuses on compressing a single band. In the preferred embodiments of the present invention in which multiple different frequency bands are being compressed, the combined signal (e.g., signal 159) for each such band includes some version of: (1) the compressed version of the signal for that band and (2) the signal(s) for adjacent band(s) (which will have some overlapping frequencies).

In any event, combined signal 159 is coupled to overshoot estimation module 160 which outputs a corresponding overshoot signal 161 (sometimes referred to as o(n)). As discussed in greater detail below, o(n) then is coupled to another input of the compressor 155, which uses that information to suppress overshooting in subsequent samples of passband signal 62. The general internal structure of the compressor 155 is depicted in FIG. 6, in order to better illustrate how such suppression is accomplished in the current embodiment.

Although a particular implementation of compressor 155 is illustrated in FIG. 6, it should be understood that any of a variety of different types of compressors instead may be utilized. For a discussion of potential dynamic range compressors and the components of them that may be used in the present invention, see the present inventor's/applicant's U.S. patent application Ser. No. 16/022,819, filed Jun. 29, 2018 (the '819 application), which is incorporated by reference herein as though set forth herein in full. Such compressors typically include a main signal path in which gain is applied to the compressor's input signal and a side chain where such gain is dynamically calculated. See also, e.g., D. Giannoulis, M. Massberg, and J. Reiss. 2012, "Digital Dynamic Range Compressor Design—A Tutorial and Analysis," Journal of Audio Engineering Society 60: pp. 399-408 (which is referred to herein as "Giannoulis 2012").

In FIG. 6, the level detector 155A is shown as being separate from the rest of the side chain processing 155B in order to illustrate the insertion point for the estimated overshoot signal 161 in the current embodiment. In multiplier 155D (in the main signal path), the gain signal 155E produced in the side chain is applied to x(n), the passband signal 62, after signal 62 has been delayed in element 155C in the current embodiment.

Figure 7:
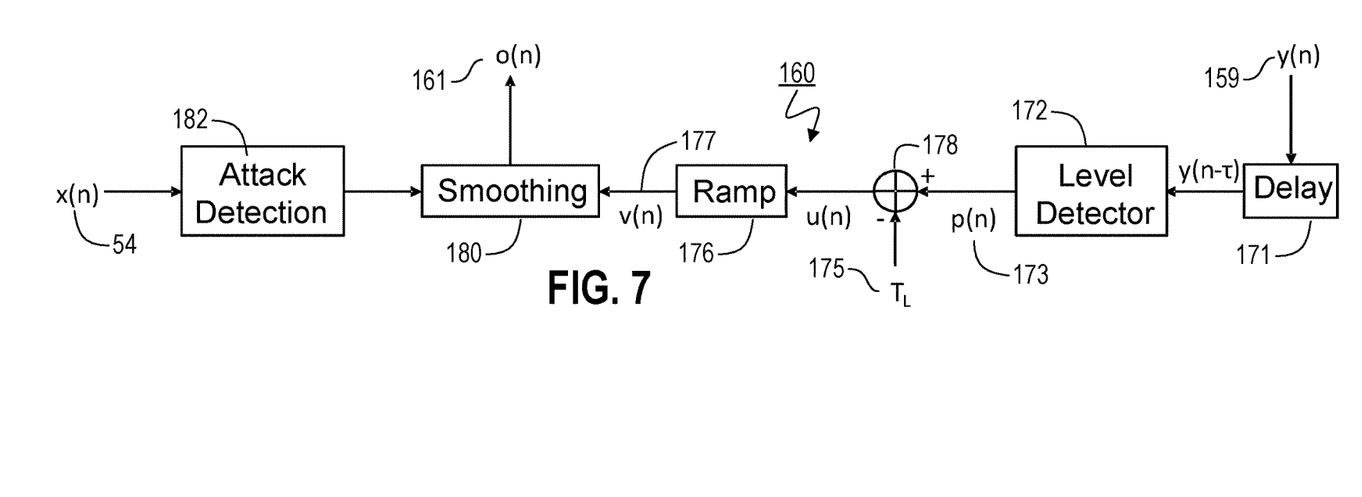
FIG. 7 is a block diagram of an overshoot estimation module.

An exemplary implementation of the overshoot estimation module 160 is illustrated in FIG. 7. As shown, the combined signal y(n) 159 is coupled to the input of delay element 171, and the output of delay element 171 is coupled to level detector 172, which then provides level signal 173 (sometimes referred to as p(n)).

A delay (provided by delay element 171) is preferred so as to avoid using the current combined signal y(n) to modify the compressor gain for the current y(n) itself, which would produce a new value for y(n). A delay of one sample means the current compressor output sample y(n) is used to modify the compressor gain for the next sample, y(n−1). While a larger delay may be used, the minimal delay of one sample is preferred.

Level detector 172 preferably provides an estimate of the level or power of its input signal. Preferably, level detector 172 calculates the absolute value or the square of the input signal. See, e.g., Giannoulis 2012.

Overshooting preferably is deemed to occur if the level signal p(n) 173, output by the level detector 172 (or any other signal indicating a level of a signal input to overshoot estimation module 160), is above a specified threshold $T_L$ 175, which in turn preferably is related to the compression threshold of the compressor 155. For example, a user might set threshold 175 (either in real time or in advance as a design parameter) somewhat higher or somewhat lower than the compressor's compression threshold in order to fine-tune the overshooting suppression.

In the current embodiment, the ramp function implemented by module 176 produces the instantaneous overshoot signal 177, as follows:

$$v(n) = \begin{cases} K(p(n) - T_L), & p(n) > T_L \\ 0, & \text{otherwise} \end{cases},$$

where K is a scale factor that may be adjusted to control how strongly the overshoot signal is fed back to the compressor 155. For this purpose, adder 178 may be implemented as a separate component (as shown in FIG. 7 to more clearly illustrate the implementation of the comparison feature, which in this case is the difference between level signal p(n) 173 and threshold $T_L$ 175) or may be incorporated into module 176. It should also be noted that the ramp function implemented (in the current embodiment) by module 176 instead can be replaced with any of a variety of other operations that provide an output signal based on a comparison (e.g., the difference) between an input signal level and a threshold. For instance, in alternate embodiments, the operation still relies on the difference between the input signal level and a specified threshold, but the piecewise linear ramp function set forth above is replaced with a function having a slope that changes continuously and/or smoothly. Also, in certain embodiments, contrary to the example given above, the overshoot signal provided by module 176 is nonzero (e.g., but small) for at least some values below the specified threshold. Thus, module 176 can be more generally referred to as overshoot signal generator 176 or instantaneous overshoot signal generator 176.

In the present embodiment, the instantaneous overshoot signal 177 can vary dramatically from sample to sample, and therefore optionally is smoothed (e.g., in module 180) to produce a steadier overshoot signal o(n) 161. Order-statistics filters, such as median and maximum filters, or any of the commonly available finite impulse response (FIR) or infinite impulse response (IIR) lowpass filters may be used within smoothing module 180. Concatenation of an order-statistics filter followed by a FIR and/or IIR filter may be used as well. Because a typical FIR or IIR filter may output negative values even if all its inputs are non-negative, any such negative values preferably are set to zero within smoothing module 180.

Figure 8:
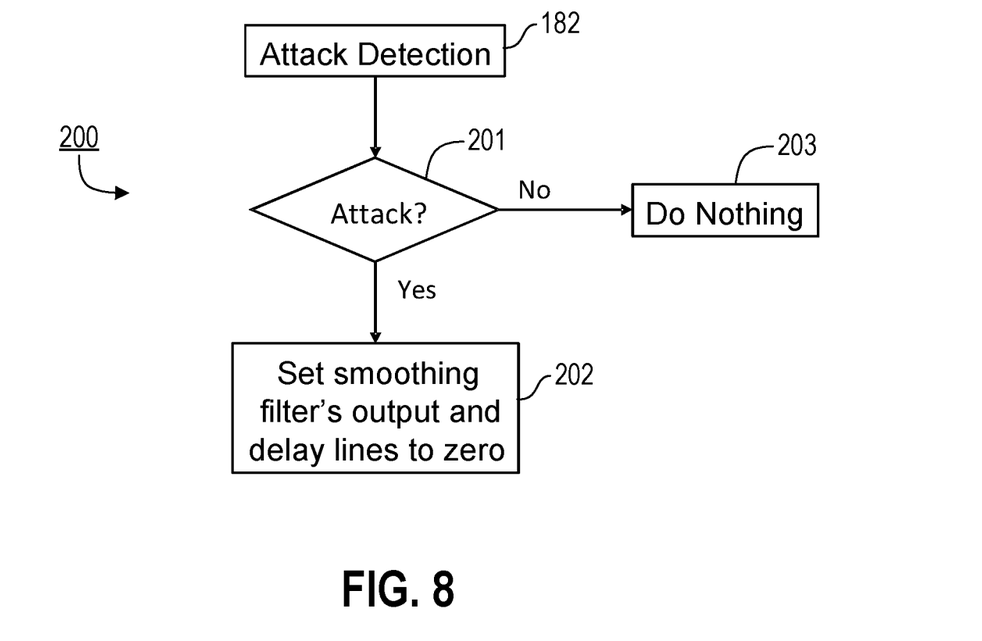
FIG. 8 is a flow diagram illustrating a process for resetting a smoothing operation based on detection of an attack.

Optionally, the smoothing operation performed by module 180 also implements the process 200 shown in FIG. 8. For this purpose, an input to the process 200 (and an additional input to smoothing module 180) is the output of attack detector 182 (shown in FIGS. 7 and 8) which, in turn, has an input coupled to the bandpassed signal 54, and, as was previously noted, a detection output (which is coupled to the smoothing module 180, as shown in FIG. 7). Referring again to FIG. 8, in step 201, a determination is made, based on the output of attack detector 182, as to whether an attack has occurred. For example, an attack is deemed to occur if the output of the attack-detection module 182 exceeds a specified threshold. In such a case, processing proceeds to step 202, in which the smoothing operation performed by smoothing module 180 is reset, e.g., by setting its output and/or at least some of its delay elements (e.g., all of them) to zero. Until then, no reset operation is performed (i.e., step 203). Any kind of attack detection algorithm(s) may be implemented by module 182, such as the crest factor described in D. Giannoulis, M. Massberg, and J. Reiss, 2013, "Parameter Automation in a Dynamic Range Compressor." Journal of the Audio Engineering Society, 716-726 (which is referred to herein as "Giannoulis 2013"), or any of the other attack-detection algorithms identified in the '819 application. Furthermore, while the input 54 to the overshoot estimation module 180 (and by extension, the attack detector 182) is shown in FIG. 6 as being coupled to the output 62 of the bandpass filter 52, the input 54 instead may be coupled to the system input 51.

The overshoot signal o(n) (with or without the optional smoothing of module 180) is applied to the side chain of the compressor 155, e.g., in order to cause the compressor to produce a smaller gain when overshoot is in fact present, e.g., to suppress overshooting in subsequent values of the output signal y(n). There are a variety of ways to accomplish this goal. One straightforward approach is shown FIG. 6, in which the overshoot signal o(n) is added to the level signal q(n) (i.e., the output of level detector 156 in the present example) within the compressor side chain. Because the overshoot signal o(n) preferably is always non-negative, the level signal, as seen by the downstream side-chain processing components 157 will become larger when overshooting occurs, thus causing the compressor 155 to produce a smaller gain.

Figure 9:
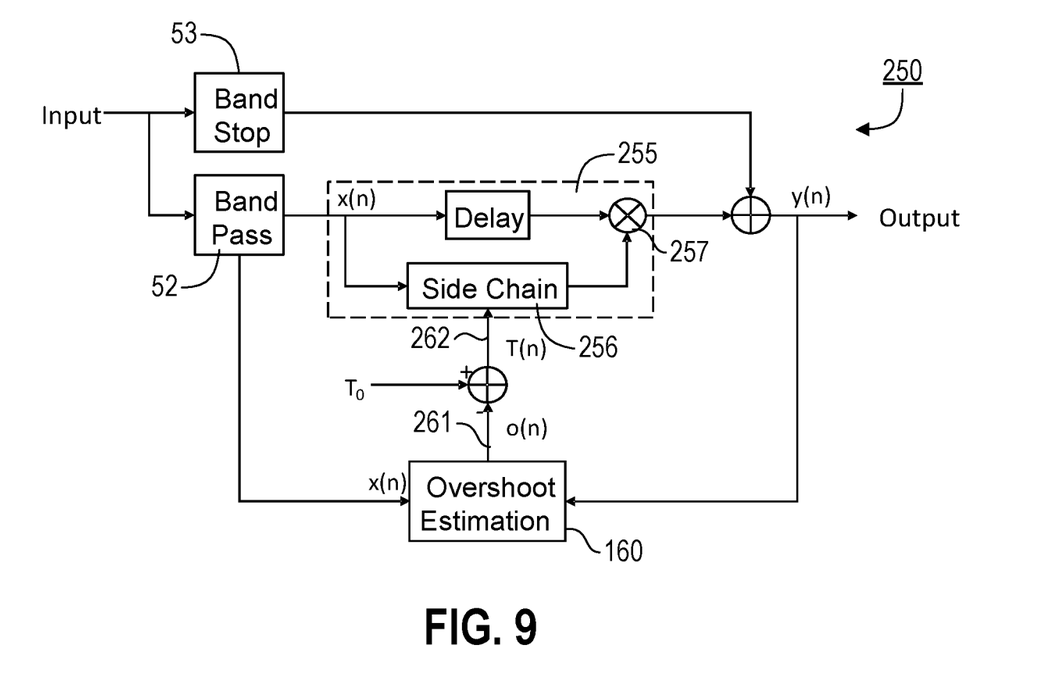
FIG. 9 is a block diagram of a dynamic compressor that provides overshooting suppression by using a feedback overshoot signal to pull down a compressor's compression threshold.

An alternative system 250, shown in FIG. 9, uses the overshoot signal o(n) 261 (output from overshoot estimation module 160) to pull down the threshold used by the compressor 255, e.g.:

$$T(n) = T_0 - o(n),$$

where $T_0$ is the original or nominal compression threshold (e.g., a threshold conventionally used for compressing the dynamic range of a signal), and T(n) is the adjusted threshold 262, which is provided to the side chain 256 of the compressor 255. Because o(n) preferably is always non-negative, the equation above ensures that the actual compression threshold T(n) is lower than the original compression threshold when overshooting occurs. Consequently, the compressor 255 will produce (in side chain 256) and apply (in multiplier 257) a smaller gain.

Figure 10:
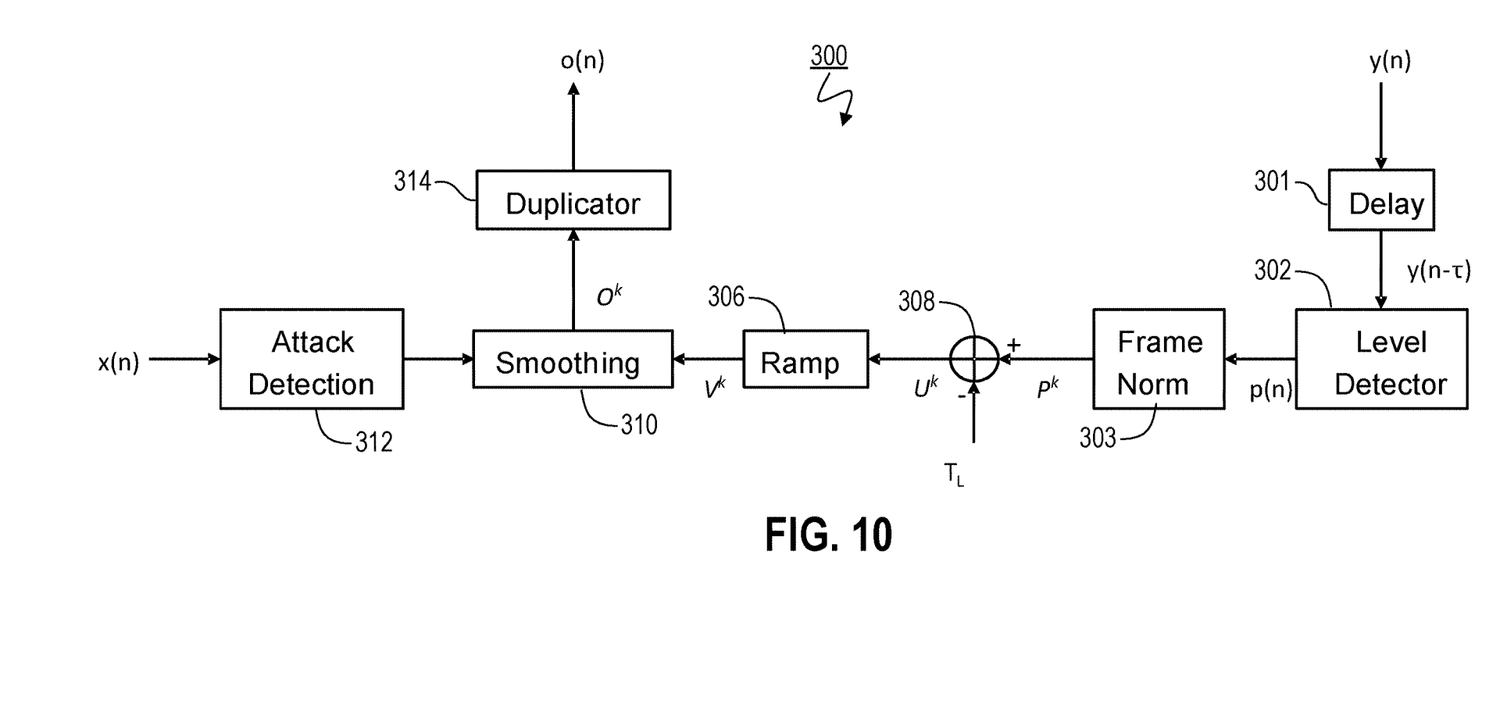
FIG. 10 is a block diagram of a frame-based overshoot estimation module.

The systems and processes above also can be adapted for frame-based processing, e.g., as shown in FIG. 10 for frame-based overshoot estimation module 300. If N denotes the number of samples in a frame, the sample index n may be represented as $$n=kN+m,$$

where k is the frame index and m is the sample index within a frame. In the context of frame-based processing, the minimal delay (e.g., the delay implemented by delay element 301) preferably is one frame, i.e., N samples. While larger delays may be used, a one-frame delay is preferred. Similar to level detector 172, level detector 302 preferably also estimates the level or power of its input signal. In fact, the same considerations typically will apply to level detector 302 as apply to level detector 172, e.g., with the operation performed by level detector 302 functioning independently of frame boundaries.

Preferably for each frame k, the frame norm module 303 calculates a single norm value to represent that frame, based and all the values in the frame (e.g., all outputs of level detector 302 in the frame). Any of a variety of different kinds of norms, such as the Euclidean norm ($L^2$ norm), $L^p$ norm, median norm, maximum norm, etc., can be generated by the frame norm module 303. Using the maximum norm as an example, $$P^k = \max_{0 \leq m < N} p^k(m)$$

can be used to represent all samples in the entire k-th frame. That is, the overshoot estimation module 300 preferably uses a single value to represent the level for all y(n) samples in the frame.

A single overshoot value can be calculated (e.g., in ramp module 306) for a given frame, e.g., as:

$$V^k = \begin{cases} K(P^k - T_L), & P^k > T_L \\ 0, & \text{otherwise} \end{cases}.$$

Other than operating on frame values, rather than sample values, the same observations and considerations discussed above in connection with ramp module 176 and adder 178 also apply to ramp module 306 and adder 308, respectively. In this embodiment, assuming the optional smoothing is performed (in smoothing module 310), preferably the smoothing operation is performed over the $V^k$ values to produce the smoothed overshoot signal $O^k$ that represents all samples in the entire $k_{th}$ frame. Otherwise, the same observations and considerations discussed above in connection with smoothing module 180 also apply to smoothing module 310.

Optionally, frame-based attack detection is used in attack-detection module 312 to determine if there is an attack in each frame. Otherwise, the same observations and considerations discussed above in connection with attack-detection module 182 also apply to attack-detection module 312. In the event that an attack is detected, the smoothing filter 310 preferably is placed into reset mode (e.g., by setting its output and delay line(s) to zero, as illustrated in FIG. 8).

The optionally smoothed overshoot signal $O^k$ is for all samples in the entire frame, so the duplicator 314 preferably duplicates this value for all samples in the frame, e.g.:

$$o(n)=o(kN+m)=O^k \text{ for } m=0,1,\ldots,N-1,$$

which can then be used (e.g., in the compressor's sidechain) to suppress overshooting in any of a variety of different ways, such as either of the structures/approaches shown in FIGS. 6 and 9 and discussed above.

Figure 11:
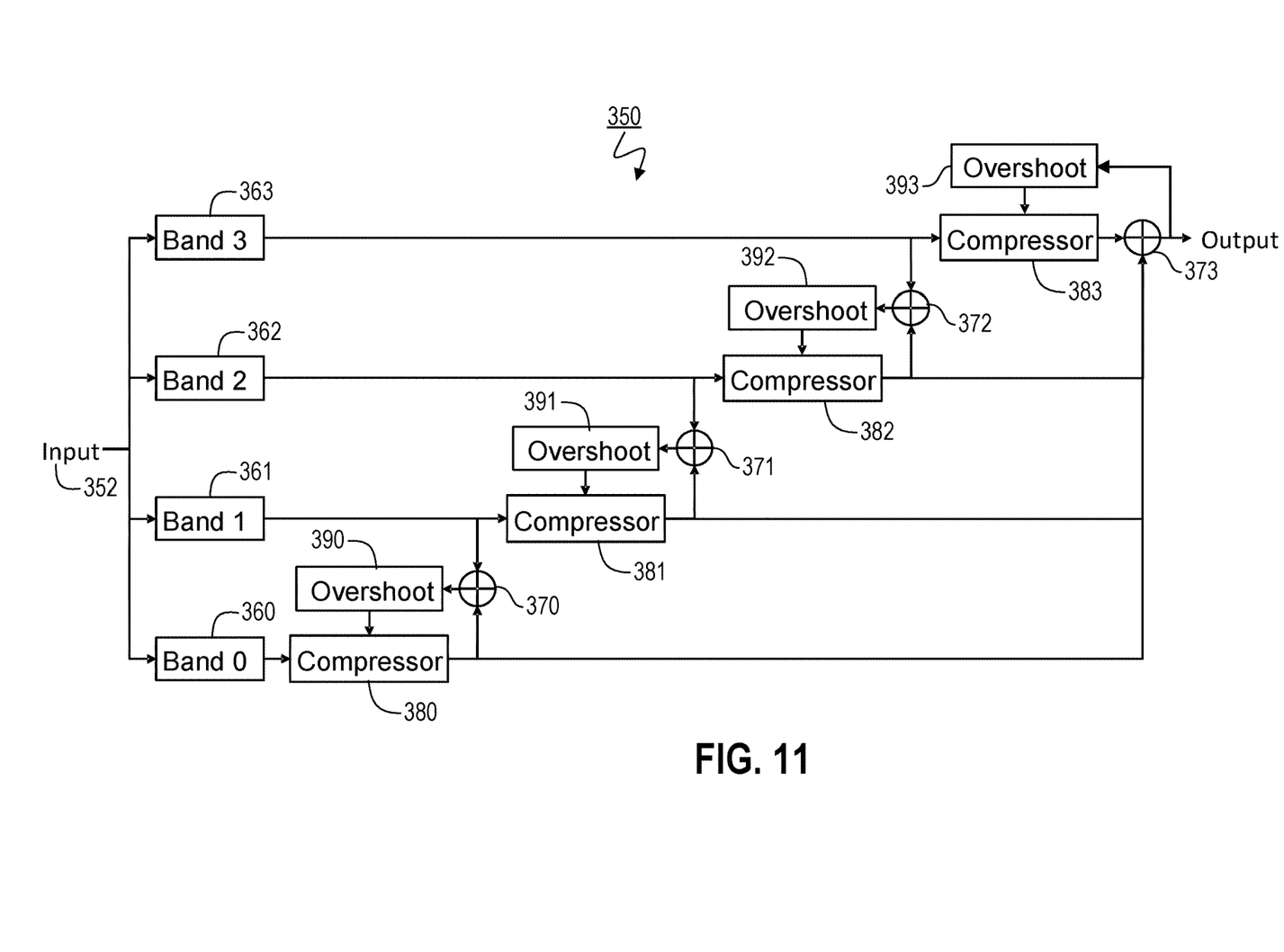
FIG. 11 is a block diagram illustrating the use of overshoot signal feedback within a multiband dynamic-range-compression system.

The delayed-overshoot-feedback approaches described above can be recursively applied in a system in which all (or at least multiple ones) of the frequency bands are compressed. An example is system 350, which is illustrated in FIG. 11.

Systems 100 and 250, described above, involve two bands that collectively encompass the entire frequency spectrum of an input signal, with one band being compressed and the other being uncompressed. In the present embodiments, two or more frequency bands encompass the entire frequency spectrum of the input signal, and each (or at least each of a subset of such bands) is dynamically range-compressed, with feedback from its adjacent bands being used to generate the overshoot signal that is fed back to the compressor for the current frequency band.

System 350 (shown in FIG. 11) exemplifies this concept for an embodiment in which the frequency spectrum of the input signal 352 is divided into four bands that collectively encompass the entire frequency spectrum of the input signal 352 by four corresponding filters 360-363, with each of such bands being compressed in its own processing branch (with input from its adjacent processing branches, as discussed in greater detail below). In FIG. 11, adjacent ones of the filters 360-363 output frequency bands that are adjacent to each other, with some amount of overlap (e.g., overlap regions 24A&B, as shown in FIG. 2) between them.

When processing the frequency band output by filter 360 (which could be the lowest frequency band or the highest frequency band, depending upon the way in which the filters are ordered), only the band output by filter 361 is adjacent. Therefore, only the signal output by filter 361 (uncompressed in the current embodiment) is combined (in adder 370) with the signal output by filter 360 (after compression in compressor 380), in order to generate the signal that is input into overshoot estimation module 390.

When processing the frequency band output by filter 361 (which is the frequency band between the bands output by filters 360 and 362), in the current embodiment only the adjacent band output by filter 362 (uncompressed) is combined (in adder 371) with the signal output by filter 361 (after compression in compressor 381), in order to generate the signal that is input into its overshoot estimation module 391.

When processing the frequency band output by filter 363 (which is the final frequency band in this example), there is no "next" frequency band to be combined with the output of compressor 383 (similar to what was done in the previous branches). Accordingly, in the present embodiment the overall system output is coupled to the input of the overshoot estimation module 393, which then generates and provides back to compressor 383 an overshoot estimate signal. In a related embodiment, overshoot estimation module 393 is omitted entirely, and no overshoot estimate signal is provided to compressor 383.

It is noted that each of the overshoot estimation modules 390-393 could, e.g., be implemented as the overshoot estimation module 160 in FIG. 7 or 300 in FIG. 10. Also, in order to simplify the illustration, with respect to each branch, the provision of the signal x(n) to the corresponding band's overshoot estimation module 390-393, which is the input to the attack-detection module of such overshoot estimation module 390-393 in the preferred embodiments, is omitted from FIG. 11.

One feature of the present structure/approach is that, for each band (other than the final one), the uncompressed output of the next band is added back to the compressed output of the current band to generate the input to the overshoot module 390-392. Taking the branch that processes the band output by filter 361 as an example, the uncompressed output of filter 362 is added back to the compressed output of filter 361 in order to generate the input to the overshoot estimation module 391. For the last band (output by filter 363), the absence of any subsequent band means that no overshoot estimation module is provided in the corresponding branch. As a result, as noted above, a different approach is used for that branch, or overshooting suppression is omitted completely for that final band.

Several observations can be made about the foregoing embodiment. First, the processing of each frequency band (other than the final one) takes into account only one adjacent band and, more specifically, the next one in the present embodiment (which is not present for the final band). Although such a structure/approach can produce good results: (1) it does not address any overshooting that might occur as a result of the other adjacent band (the previous band in the current example), if present; and (2) the roll-off of the bandpass filters 360-363 typically might extend to such other adjacent bands, meaning that overshooting suppression in this embodiment might not be comprehensive.

Figure 12:
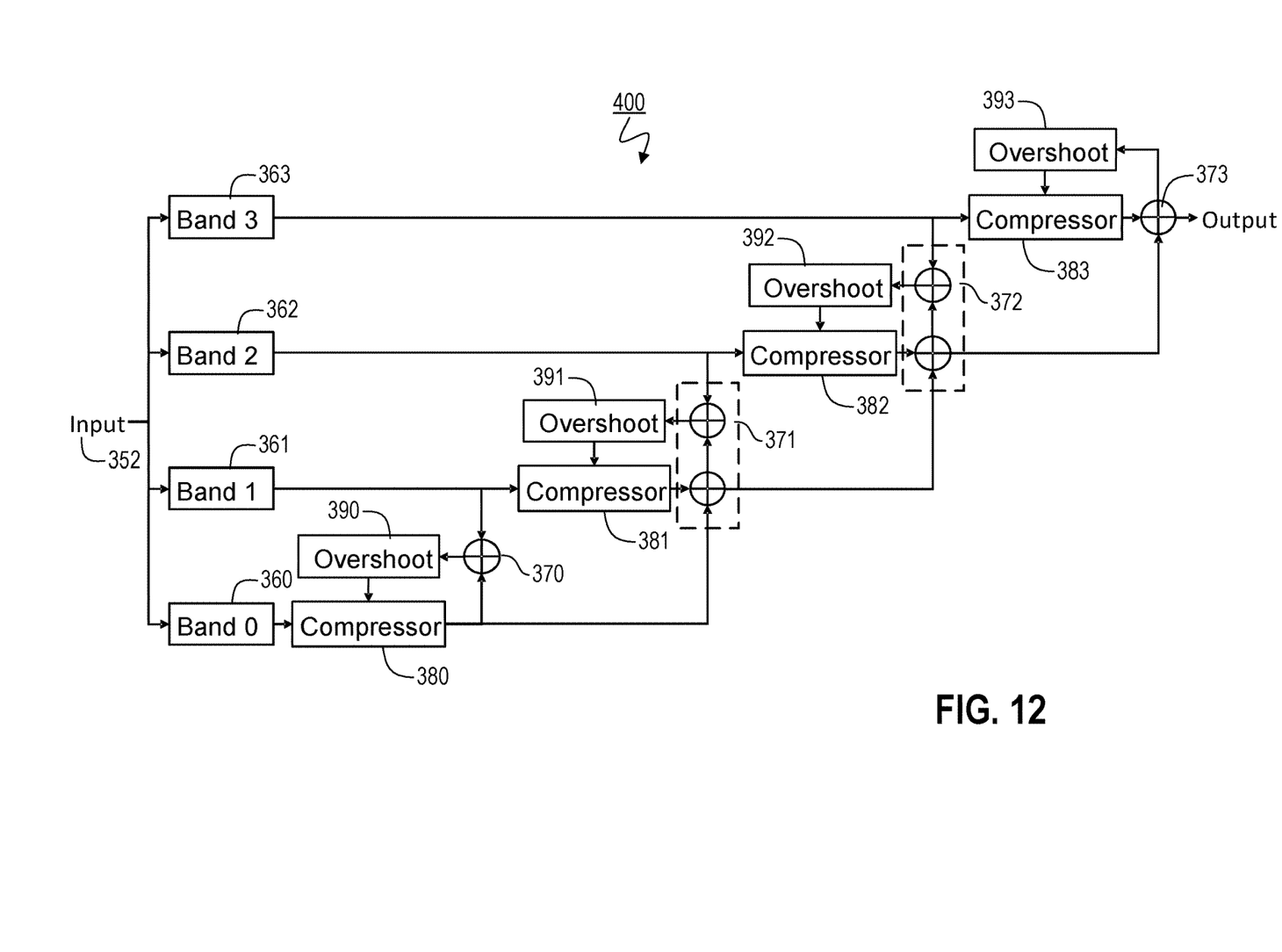
FIG. 12 is a block diagram illustrating a multiband dynamic-range compression system using overshoot signal feedback from just a single next adjacent frequency band and all previous bands.

Thus, FIG. 12 illustrates a system 400 that can mitigate this problem. The main difference from system 350 (shown in FIG. 11) is that in system 400 the sum of the compressed signals from previous bands also is used (together with the uncompressed signal from the subsequent band) in calculating the overshoot signal (in the corresponding one of system 400's overshoot estimation modules 390-393). This sum of compressed signals from previous bands carries much of the slow roll-off effects of bandpass filters and non-perfectly suppressed overshooting from previous bands, so adding it to the input of the corresponding overshoot estimation module 391-393 helps suppress their effects. For the final band processed by system 400 (i.e., the band output by filter 363), due to the lack of any "next band", the total output (generated by adder 373) is provided to the corresponding overshoot estimation module 393. As noted above, most of the overshoot to be addressed results from overlap between the current band being processed and the bands immediately adjacent to it.

In system 400, the frequency bands are processed somewhat sequentially (and somewhat in parallel) so, e.g., the outputs of compressors 380 and 381 are available to be (and, therefore in fact, are) provided to overshoot estimation module 392, but the output of compressor 383 is not, so instead the uncompressed output of filter 363 is provided to overshoot estimation module 392. More generally, in system 400, when processing a current frequency band, the earlier-processed band(s), if any, are provided to the current band's overshoot estimation module in compressed format while the subsequently processed band, if any, is provided in an uncompressed format. In alternate embodiments, potentially subject to other timing constraints, any or all of such bands could be provided in compressed or uncompressed format, with compressed format being preferred, using appropriate delay elements to ensure that the desired compressed signals are available. However, even if theoretically possible, in many cases, the additional performance benefits that might be obtained would not justify the additional delay that would be introduced.

As shown in FIG. 12, compressed versions of the previously processed frequency band(s) are provided to the overshoot estimation module (the corresponding one of modules 390-393) for the processing of the current frequency band through a cascading sequence of adders (e.g., the input to overshoot estimation module 392 is generated through adders 370, 371 and 372). It is noted that, in the current embodiment, adders 371 and 372 are structures as compound adders, each having to two-input adders that collectively provide three inputs and two outputs (i.e., a final output and an intermediate output).

Also, in alternate embodiments, rather than inputting all the previously processed bands into the present overshoot estimation modules (i.e., one of modules 390-393), only the immediately previous band is input. For instance, when processing the frequency band output by filter 362 in this alternate embodiment, only the two adjacent bands (output by filters 361 and 363), are input into the overshoot estimation module 392.

Finally, while a four-band audio signal dynamic range compression system 350 is used to exemplify the invention in the preceding discussion (e.g., in reference to FIGS. 11 and 12 and the potential variations on those corresponding system 350 of 400), it should be noted that the same or similar processes and structures can be applied in processing any number of bands.

System Environment.

Generally speaking, except where clearly indicated otherwise, all of the systems, methods, modules, components, functionality and techniques described herein can be practiced with the use of one or more programmable general-purpose computing devices. Such devices (e.g., including any of the electronic devices mentioned herein) typically will include, for example, at least some of the following components coupled to each other, e.g., via a common bus: (1) one or more central processing units (CPUs); (2) read-only memory (ROM); (3) random access memory (RAM); (4) other integrated or attached storage devices; (5) input/output software and circuitry for interfacing with other devices (e.g., using a hardwired connection, such as a serial port, a parallel port, a USB connection or a FireWire connection, or using a wireless protocol, such as radio-frequency identification (RFID), any other near-field communication (NFC) protocol, Bluetooth or a 802.11 protocol); (6) software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; (7) a display (such as a cathode ray tube display, a liquid crystal display, an organic light-emitting display, a polymeric light-emitting display or any other thin-film display); (8) other output devices (such as one or more speakers, a headphone set, a laser or other light projector and/or a printer); (9) one or more input devices (such as a mouse, one or more physical switches or variable controls, a touchpad, tablet, touch-sensitive display or other pointing device, a keyboard, a keypad, a microphone and/or a camera or scanner); (10) a mass storage unit (such as a hard disk drive or a solid-state drive); (11) a real-time clock; (12) a removable storage read/write device (such as a flash drive, any other portable drive that utilizes semiconductor memory, a magnetic disk, a magnetic tape, an opto-magnetic disk, an optical disk, or the like); and/or (13) a modem (e.g., for sending faxes or for connecting to the Internet or to any other computer network). In operation, the process steps to implement the above methods and functionality, to the extent performed by such a general-purpose computer, typically initially are stored in mass storage (e.g., a hard disk or solid-state drive), are downloaded into RAM, and then are executed by the CPU out of RAM. However, in some cases the process steps initially are stored in RAM or ROM and/or are directly executed out of mass storage.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, one or more server boxes, workstations, personal (e.g., desktop, laptop, tablet or slate) computers and/or even smaller computers, such as personal digital assistants (PDAs), wireless telephones (e.g., smartphones) or any other programmable appliance or device, whether stand-alone, hard-wired into a network or wirelessly connected to a network.

In addition, although general-purpose programmable devices have been described above, in alternate embodiments one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these approaches, with the particular implementation being selected based on known engineering tradeoffs. More specifically, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality and/or for implementing the modules and components of this invention. Such media include, by way of example, magnetic disks, magnetic tape, optically readable media such as CDs and DVDs, or semiconductor memory such as various types of memory cards, USB flash memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

In addition, where the present disclosure refers to a processor, computer, server, server device, computer-readable medium or other storage device, client device, or any other kind of apparatus or device, such references should be understood as encompassing the use of plural such processors, computers, servers, server devices, computer-readable media or other storage devices, client devices, or any other such apparatuses or devices, except to the extent clearly indicated otherwise. For instance, a server generally can (and often will) be implemented using a single device or a cluster of server devices (either local or geographically dispersed), e.g., with appropriate load balancing. Similarly, a server device and a client device often will cooperate in executing the process steps of a complete method, e.g., with each such device having its own storage device(s) storing a portion of such process steps and its own processor(s) executing those process steps.

Additional Considerations.

As used herein, the term "coupled", or any other form of the word, is intended to mean either directly connected or connected through one or more other elements or processing blocks, e.g., for the purpose of preprocessing. In the drawings and/or the discussions of them, where individual steps, modules or processing blocks are shown and/or discussed as being directly connected to each other, such connections should be understood as couplings, which may include additional steps, modules, elements and/or processing blocks. Unless otherwise expressly and specifically stated otherwise herein to the contrary, references to a signal herein mean any processed or unprocessed version of the signal. That is, specific processing steps discussed and/or claimed herein are not intended to be exclusive; rather, intermediate processing may be performed between any two processing steps expressly discussed or claimed herein.

Where a specific value is mentioned herein, such a reference means that value or substantially that value, which includes values that are not substantially different from the stated value, i.e., permitting deviations that would not have substantial impact within the identified context. For example, stating that a continuously variable signal level is set to zero (0) would include a value of exactly 0, as well as small values that produce substantially the same effect as a value of 0.

In the preceding discussion, the terms "operators", "operations", "functions" and similar terms refer to process steps or hardware components, depending upon the particular implementation/embodiment.

In the event of any conflict or inconsistency between the disclosure explicitly set forth herein or in the accompanying drawings, on the one hand, and any materials incorporated by reference herein, on the other, the present disclosure shall take precedence. In the event of any conflict or inconsistency between the disclosures of any applications or patents incorporated by reference herein, the disclosure most recently added or changed shall take precedence.

Unless clearly indicated to the contrary, words such as "optimal", "optimize", "maximize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing or manufacturing constraints.

In the above discussion, certain methods are explained by breaking them down into steps listed in a particular order. Similarly, certain processing is performed by showing and/or describing modules arranged in a certain order. However, it should be noted that in each such case, except to the extent clearly indicated to the contrary or mandated by practical considerations (such as where the results from one step are necessary to perform another), the indicated order is not critical but, instead, that the described steps and/or modules can be reordered and/or two or more of such steps (or the processing within two or more of such modules) can be performed concurrently.

References herein to a "criterion", "multiple criteria", "condition", "conditions" or similar words which are intended to trigger, limit, filter or otherwise affect processing steps, other actions, the subjects of processing steps or actions, or any other activity or data, are intended to mean "one or more", irrespective of whether the singular or the plural form has been used. For instance, any criterion or condition can include any combination (e.g., Boolean combination) of actions, events and/or occurrences (i.e., a multi-part criterion or condition).

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

In the discussions above, the words "include", "includes", "including", and all other forms of the word should not be understood as limiting, but rather any specific items following such words should be understood as being merely exemplary.

Several different embodiments of the present invention are described above and/or in any documents incorporated by reference herein, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the intent and the scope of the invention. Accordingly, the invention is not limited to the precise embodiments shown in the drawings and described above. Rather, it is intended that all such variations not departing from the intent of the invention are to be considered as within the scope thereof as limited solely by the claims appended hereto.

What is claimed is:

1. An audio-signal dynamic-range-compression system, comprising:
   (a) an input line for accepting an input signal;
   (b) a filter set coupled to the input line that divides the input signal into a set of frequency bands, including a first frequency band and a second frequency band;
   (c) a compressor having a first input that receives the first frequency band, a second input and an output;
   (d) an adder having a first input coupled to the first frequency band through the compressor, a second input coupled to the second frequency band, and an output; and
   (e) an overshoot estimation module having an input coupled to the output of the adder and an output coupled to the second input of the compressor, so that the second input of the compressor receives an overshoot estimate signal from the overshoot estimation module,
   wherein the output of the overshoot estimation module provides an overshoot signal that indicates a result of a comparison between a signal at the input of said overshoot estimation module and a specified threshold.

2. An audio-signal dynamic-range-compression system according to claim 1, wherein the overshoot estimation module introduces a delay so that an amount of overshoot of a current sample of the signal provided at the output of the compressor is used to modify a gain applied by the compressor to a subsequent sample applied at the first input of the compressor.

3. An audio-signal dynamic-range-compression system according to claim 1, wherein the overshoot estimation module includes a level detector having (a) an input coupled to the input of the overshoot estimation module, and (b) an output that provides a smoothed signal level, across a plurality of samples at said input of the level detector, and wherein said smoothed signal level is used to generate the overshoot signal.

4. An audio-signal dynamic-range-compression system according to claim 1, wherein the overshoot estimation module includes an overshoot signal generator having: (a) an input coupled to the input of the overshoot estimation module, and (b) an output providing an overshoot signal that is a function of a difference between a signal received at the input of the overshoot signal generator and the specified threshold.

5. An audio-signal dynamic-range-compression system according to claim 1, wherein the overshoot estimation module includes an overshoot signal generator having:
   (a) an input coupled to the input of the overshoot estimation module, and (b) an output providing an overshoot signal that is a function of a comparison between a signal received at the input of the overshoot signal generator and the specified threshold.

6. An audio-signal dynamic-range-compression system according to claim 5, wherein the overshoot estimation module also includes a smoothing module having: (a) an input coupled to the output of the overshoot signal generator, and (b) an output, coupled to the output of the overshoot estimation module, providing a lowpass-filtered version of a signal received at the input of the smoothing module.

7. An audio-signal dynamic-range-compression system according to claim 6, wherein the overshoot estimation module also includes: (a) a second input that receives the first frequency band and (b) an attack-detection module, and wherein said attack-detection module has an input coupled to the second input of the overshoot estimation module and an output that provides a signal indicating whether an attack is occurring within the first frequency band.

8. An audio-signal dynamic-range-compression system according to claim 7, wherein the smoothing module: (a) also has a second input, one that is coupled to the output of the attack-detection module, and (b) resets a smoothing operation performed by said smoothing module when the second input of said smoothing module receives a signal indicating that an attack is occurring within the first frequency band.

9. An audio-signal dynamic-range-compression system according to claim 8, wherein said smoothing operation performed by said smoothing module is reset, in response to said signal indicating that an attack is occurring within the first frequency band, by setting the output of the smoothing module and all delay elements within the smoothing module to zero.

10. An audio-signal dynamic-range-compression system according to claim 1, wherein the compressor includes: (a) a main signal path in which a gain is applied to a signal on the first input of the compressor; and (b) a side-chain path, parallel to the main signal path, in which said gain is determined, and wherein the overshoot signal is used to modify a signal in the side-chain path that indicates a current strength of the first frequency band.

11. An audio-signal dynamic-range-compression system according to claim 1, wherein the compressor includes: (a) a main signal path in which a gain is applied to a signal on the first input of the compressor; and (b) a side-chain path, parallel to the main signal path, in which said gain is determined, wherein the overshoot signal is used to modify a compression threshold used by the side-chain path.

12. An audio-signal dynamic-range-compression system according to claim 1, wherein the input signal is frame-based and the overshoot estimation module operates in a mode such that, for each frame of samples, the output of the overshoot estimation module is the same for all samples in said frame.

13. An audio-signal dynamic-range-compression system according to claim 1, further comprising:
a second compressor having: a first input that receives the second frequency band, a second input and an output;
(g) a second adder having: a first input coupled to the output of the second compressor, a second input coupled to the first frequency band, and an output; and
(h) a second overshoot estimation module having: an input coupled to the output of the second adder and an output coupled to the second input of the second compressor,
wherein the output of the second overshoot estimation module provides a second overshoot signal that indicates a result of a comparison between a signal at the input of said second overshoot estimation module and a second specified threshold.

14. An audio-signal dynamic-range-compression system according to claim 13, wherein the first frequency band is coupled to the second input of the second adder through the compressor.

15. An audio-signal dynamic-range-compression system according to claim 13, wherein the set of frequency bands also includes a third frequency band, and wherein the second adder has an input that is coupled to said third frequency band.

16. An audio-signal dynamic-range-compression system according to claim 15, wherein said third frequency band is coupled to said input of the second adder in an uncompressed format.

17. An audio-signal dynamic-range-compression system according to claim 15, further comprising:
(i) a third compressor having: a first input that receives the third frequency band, a second input and an output;
(j) a third adder having: a first input coupled to the output of the third compressor, a second input coupled to the second frequency band, and an output; and
(k) a third overshoot estimation module having: an input coupled to the output of the third adder and an output coupled to the second input of the third compressor,
wherein the output of the third overshoot estimation module provides a third overshoot signal that indicates a result of a comparison between a signal at the input of said third overshoot estimation module and a third specified threshold.

18. An audio-signal dynamic-range-compression system according to claim 17, wherein the second frequency band is coupled to the second input of the third adder through the second compressor.

19. An audio-signal dynamic-range-compression system according to claim 18, wherein the first frequency band is coupled to an input of the third adder through the compressor.

20. An audio-signal dynamic-range-compression system according to claim 17, wherein the set of frequency bands also includes a fourth frequency band, and wherein the third adder has an input that is coupled to said fourth frequency band.

* * * * *

UNITED STATES PATENT AND TRADEMARK OFFICE
CERTIFICATE OF CORRECTION

PATENT NO. : 10,755,722 B2  
APPLICATION NO. : 16/115840  
DATED : August 25, 2020  
INVENTOR(S) : Yuli You Page 1 of 1

It is certified that error appears in the above-identified patent and that said Letters Patent is hereby corrected as shown below:

In the Specification

Column 1 Line 7, change "Oil The present invention" to -- The present invention --.

Column 7 Line 64, change "all samples in the entire $k_{th}$ frame" to -- all samples in the entire $k^{th}$ frame --.

Signed and Sealed this  
Twentieth Day of October, 2020

Andrei Iancu  
*Director of the United States Patent and Trademark Office*